(12) United States Patent
Fuse

(10) Patent No.: US 11,764,100 B2
(45) Date of Patent: Sep. 19, 2023

(54) HEAT TREATMENT SUSCEPTOR AND HEAT TREATMENT APPARATUS

(71) Applicant: SCREEN Holdings Co., Ltd., Kyoto (JP)

(72) Inventor: Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 680 days.

(21) Appl. No.: 16/380,878

(22) Filed: Apr. 10, 2019

(65) Prior Publication Data

US 2019/0237355 A1  Aug. 1, 2019

Related U.S. Application Data

(62) Division of application No. 15/382,828, filed on Dec. 19, 2016, now abandoned.

(30) Foreign Application Priority Data

Feb. 3, 2016 (JP) ................... 2016-018849

(51) Int. Cl.
*H01L 21/687* (2006.01)
*H01L 21/67* (2006.01)

(52) U.S. Cl.
CPC .. *H01L 21/68742* (2013.01); *H01L 21/67115* (2013.01); *H01L 21/6875* (2013.01); *H01L 21/68707* (2013.01)

(58) Field of Classification Search
CPC .... H05B 2203/032; H05B 3/44; H05B 3/009; H05B 3/145; F24C 7/043

(Continued)

(56) References Cited

U.S. PATENT DOCUMENTS

2001/0055689 A1  12/2001  Park
2005/0016466 A1*  1/2005  Scudder .............. H01L 21/6875
118/728

(Continued)

FOREIGN PATENT DOCUMENTS

JP  2003-051504 A  2/2003
JP  2003-338505 A  11/2003

(Continued)

OTHER PUBLICATIONS

Japanese Decision to Grant a Patent dated Jan. 7, 2020 in corresponding Japanese Patent Application No. 2016-018849.

(Continued)

*Primary Examiner* — Tu B Hoang
*Assistant Examiner* — Thomas J Ward
(74) *Attorney, Agent, or Firm* — OSTROLENK FABER LLP

(57) ABSTRACT

A plurality of substrate support pins are provided upright on a holding plate so as to contact a position on which no stress is exerted in a lower surface of a semiconductor wafer when an upper surface of the semiconductor wafer is irradiated with flash light emitted from a flash lamp and thus reaches a maximum temperature. When the application of the flash light causes the upper surface of the semiconductor wafer to warp such that the upper surface becomes raised, stress concentration does not occur in the contact position of the lower surface of the semiconductor wafer that contacts the plurality of substrate support pins. The semiconductor wafer can be prevented from breaking during the application of the flash light.

3 Claims, 10 Drawing Sheets

(58) Field of Classification Search
USPC ......... 392/407, 416, 418; 438/795; 219/390, 219/679
See application file for complete search history.

(56) References Cited

U.S. PATENT DOCUMENTS

| | | |
|---|---|---|
| 2009/0175605 A1* | 7/2009 | Kobayashi ........ H01L 21/67115 392/416 |
| 2014/0169772 A1* | 6/2014 | Abe .................... H05B 3/0047 392/418 |
| 2014/0235072 A1 | 8/2014 | Ito ............................... 438/795 |
| 2016/0284575 A1 | 9/2016 | Ito |
| 2017/0140976 A1 | 5/2017 | Abe et al. |

FOREIGN PATENT DOCUMENTS

| | | |
|---|---|---|
| JP | 2007-188914 A | 7/2007 |
| JP | 2009-164451 | 7/2009 |
| JP | 2013-206897 A | 10/2013 |
| JP | 2014-120497 A | 6/2014 |
| JP | 2014-157968 | 8/2014 |
| JP | 2014-157968 A | 8/2014 |
| TW | 201430913 A1 | 8/2014 |

OTHER PUBLICATIONS

Office Action dated Jan. 10, 2018 in corresponding Taiwanese Patent Application No. 105140220 with partial English translation.
Notice of Reasons for Refusal dated Aug. 6, 2019 in counterpart Japanese Patent Application No. 2016-018849 with computer generated English translation obtained from the Japanese Patent Office.

* cited by examiner

F I G . 4
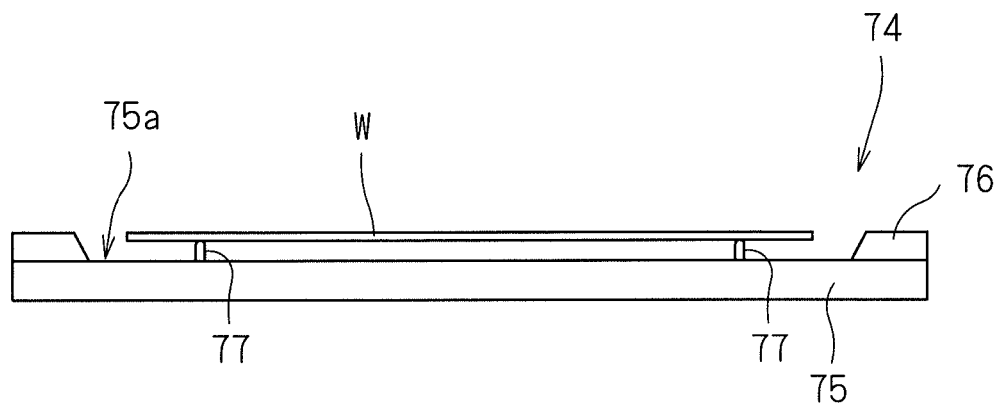

F I G . 8
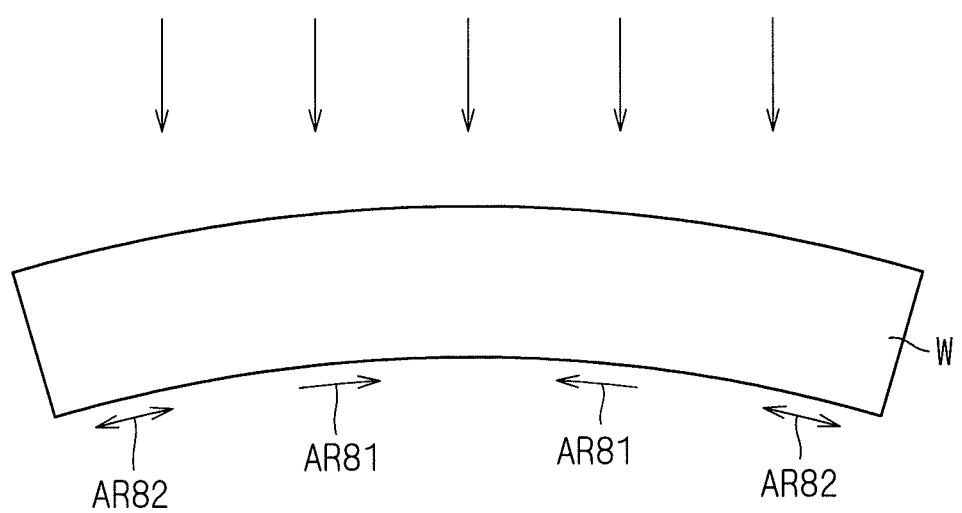

HEAT TREATMENT SUSCEPTOR AND HEAT TREATMENT APPARATUS

CROSS-REFERENCE TO RELATED APPLICATIONS

The present application is a divisional of prior U.S. patent application Ser. No. 15/382,828, filed Dec. 19, 2016, by Kazuhiko FUSE, entitled "HEAT TREATMENT SUSCEPTOR AND HEAT TREATMENT APPARATUS," which claims priority to Japanese Patent Application No. JP2016-018849, filed Feb. 3, 2016. The entire contents of each of these patent applications are incorporated herein by reference.

BACKGROUND OF THE INVENTION

Field of the Invention

The present invention relates to a heat treatment susceptor that holds a thin-plate precision electronic substrate (hereinafter, merely referred to as a "substrate"), such as a semiconductor wafer, that is irradiated with flash light emitted from a flash lamp for heat treatment of the substrate, and relates to a heat treatment apparatus that includes the heat treatment susceptor.

Description of Background Art

In the process of manufacturing a semiconductor device, the introduction of impurities is an essential step for forming pn junctions in a semiconductor wafer. At present, it is common to introduce impurities by ion implantation and subsequent annealing. Ion implantation is a technique for physically implanting impurities by causing impurity elements such as boron (B), arsenic (As), and phosphorus (P) to be ionized and collide with a semiconductor wafer with a high acceleration voltage. The implanted impurities are activated by annealing. If, at this time, annealing time is approximately several seconds or longer, the implanted impurities are deeply diffused by heat. As a result, a junction depth may become deeper than necessary, possibly interfering with the formation of an excellent device.

For this reason, flash-lamp annealing (FLA) has recently been receiving attention as an annealing technique for heating a semiconductor wafer in an extremely short time. Flash-lamp annealing is a heat treatment technique using xenon flash lamps (hereinafter, "flash lamps" simply referred to indicate xenon flash lamps) to irradiate the surface of a semiconductor wafer with flash light such that the temperature of only the surface of the semiconductor wafer that is implanted with impurities is raised in an extremely short time (several milliseconds or less).

The xenon flash lamps have a spectral distribution of radiation ranging from ultraviolet regions to near-infrared regions. The wavelength of light emitted from the xenon flash lamps is shorter than that of light emitted from conventional halogen lamps and substantially coincides with the fundamental absorption band of a silicon semiconductor wafer. Thus, the temperature of the semiconductor wafer can be rapidly increased with a small amount of transmitted light when the semiconductor wafer is irradiated with flash light from the xenon flash lamps. It has also been determined that the irradiation with flash light in an extremely short time of several milliseconds or less can selectively raise the temperature of only the vicinity of the surface of the semiconductor wafer. Accordingly, such a temperature rise in an extremely short time using the xenon flash lamps allows the impurities to be only activated without being deeply diffused.

As examples of typical heat treatment apparatuses with flash lamps, US 2009/0175605 and US 2014/0235072, for example, disclose heat treatment apparatuses that include flash lamps emitting flash light to a semiconductor wafer supported by a plurality of support pins provided upright on a susceptor.

However, since the flash lamps instantaneously emit the flash light having extremely high energy to the front surface of the semiconductor wafer, the temperature of the front surface of the semiconductor wafer instantaneously rapidly increases while the temperature of the back surface does not increase so much. Thus, abrupt thermal expansion occurring only in the front surface of the semiconductor wafer causes deformation in the semiconductor wafer such that the front surface warps and becomes raised. As a result, stress concentration in the back surface of the semiconductor wafer causes the semiconductor wafer to break.

SUMMARY OF THE INVENTION

The present invention is directed to a heat treatment susceptor that holds a substrate irradiated with flash light emitted from a flash lamp for heat treatment of the substrate.

In an aspect of the present invention, the heat treatment susceptor includes: a holding plate having a planar holding surface; and a plurality of support pins that are provided upright on the holding surface and contact a lower surface of the substrate at upper ends to support the substrate. The plurality of support pins are provided upright so as to contact a position on which no stress is exerted in the lower surface of the substrate when an upper surface of the substrate is irradiated with flash light emitted from the flash lamp and thus reaches a maximum temperature.

Stress concentration does not occur in the contact position of the lower surface of the substrate that contacts the support pins during the application of the flash light. This can prevent the substrate from breaking during the application of the flash light emitted from the flash lamp.

The present invention is also directed to a heat treatment apparatus that heats the substrate by applying flash light to the substrate.

In an aspect of the present invention, the heat treatment apparatus includes: a chamber that houses a substrate; the heat treatment susceptor according to claim 1; and a flash lamp that applies flash light to the substrate held by the heat treatment susceptor.

The substrate heat-treated by the application of the flash light in the heat treatment apparatus can be prevented from breaking.

The present invention therefore has an object to prevent the substrate from breaking during the application of the flash light from the flash lamp.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of the susceptor;

FIG. 8 is a schematic view showing how a semiconductor wafer warps during application of flash light;

DESCRIPTION OF THE PREFERRED EMBODIMENT

Hereinafter, a preferred embodiment of the present invention will be described in detail with reference to the drawings.

Figure 1:
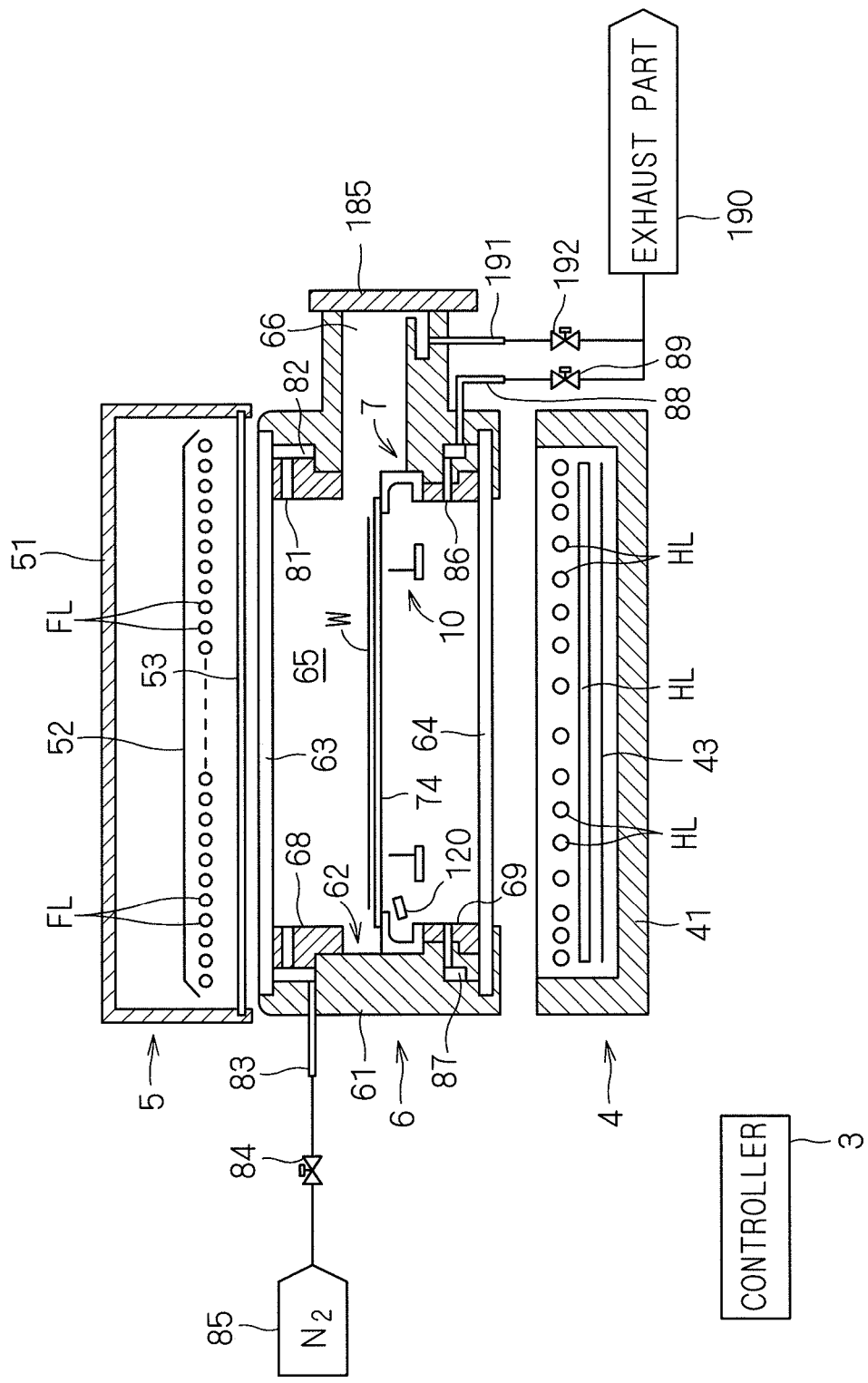
FIG. 1 is a longitudinal cross-sectional view showing a configuration of a heat treatment apparatus according to the present invention.

FIG. 1 is a longitudinal cross-sectional view showing a configuration of a heat treatment apparatus 1 according to the present invention. The heat treatment apparatus 1 in this preferred embodiment is a flash-lamp annealing apparatus that heats a disc-shaped semiconductor wafer W serving as a substrate by applying flash light to the semiconductor wafer W. Although the size of the semiconductor wafer W to be treated is not particularly limited, the semiconductor wafer W may have a diameter of, for example, 300 mm or 450 mm. The semiconductor wafer W is implanted with impurities before being transported into the heat treatment apparatus 1, and the implanted impurities are activated through heat treatment by the heat treatment apparatus 1. To facilitate the understanding, the dimensions and number of each part are exaggerated or simplified as necessary in FIG. 1 and subsequent drawings.

The heat treatment apparatus 1 includes a chamber 6 that houses the semiconductor wafer W, a flash heater 5 with a plurality of built-in flash lamps FL, and a halogen heater 4 with a plurality of built-in halogen lamps HL. The flash heater 5 is provided above the chamber 6, and the halogen heater 4 is provided below the chamber 6. The heat treatment apparatus 1 also includes, within the chamber 6, a holder 7 that holds the semiconductor wafer W in a horizontal position, and a transfer mechanism 10 that transfers the semiconductor wafer W between the holder 7 and the outside of the apparatus. The heat treatment apparatus 1 further includes a controller 3 that controls operating mechanisms located in the halogen heater 4, the flash heater 5, and the chamber 6 for heat treatment of the semiconductor wafer W.

The chamber 6 is formed of a tubular chamber side portion 61 and quartz chamber windows attached to the top and bottom of the chamber side portion 61. The chamber side portion 61 has a substantially tubular shape that is open at the top and bottom, the opening at the top being equipped with and closed by an upper chamber window 63, the opening at the bottom being equipped with and closed by a lower chamber window 64. The upper chamber window 63, which forms the ceiling portion of the chamber 6, is a disc-shaped member made of quartz and functions as a quartz window that allows flash light emitted from the flash heater 5 to pass through into the chamber 6. The lower chamber window 64, which forms the floor portion of the chamber 6, is also a disc-shaped member made of quartz and functions as a quartz window that allows light emitted from the halogen heater 4 to pass through into the chamber 6.

A reflection ring 68 is mounted on the upper portion of the inner wall surface of the chamber side portion 61, and a reflection ring 69 is mounted on the lower portion thereof. Both of the reflection rings 68 and 69 have an annular shape. The upper reflection ring 68 is mounted by being fitted from above the chamber side portion 61. On the other hand, the lower reflection ring 69 is mounted by being fitted from below the chamber side portion 61 and fastened with screws (not shown). In other words, the reflection rings 68 and 69 are both removably mounted on the chamber side portion 61. The chamber 6 has an inner space that is surrounded by the upper chamber window 63, the lower chamber window 64, the chamber side portion 61, and the reflection rings 68 and 69 and that is defined as a heat treatment space 65.

With the reflection rings 68 and 69 mounted on the chamber side portion 61, the chamber 6 has a recessed portion 62 in its inner wall surface. In other words, the recessed portion 62 is formed by being surrounded by a central portion of the inner wall surface of the chamber side portion 61 on which the reflection rings 68 and 69 are not mounted, a lower end face of the reflection ring 68, and an upper end face of the reflection ring 69. The recessed portion 62 is horizontally formed in an annular shape in the inner wall surface of the chamber 6 and surrounds the holder 7 that holds the semiconductor wafer W.

The chamber side portion 61 and the reflection rings 68 and 69 are each made of a metal material (e.g., stainless steel) having excellent strength and excellent heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closeable with a gate valve 185. The transport opening 66 is communicatively connected to the outer circumferential surface of the recessed portion 62. When opened by the gate valve 185, the transport opening 66 allows the semiconductor wafer W to be transported into and out of the heat treatment space 65 from the transport opening 66 through the recessed portion 62. When the transport opening 66 is closed by the gate valve 185, the heat treatment space 65 in the chamber 6 becomes an enclosed space.

The chamber 6 has, in its upper portion of the inner wall, a gas supply port 81 through which a treatment gas (in the present embodiment, nitrogen gas ($N_2$)) is supplied to the heat treatment space 65. The gas supply port 81 is formed at a position above the recessed portion 62 and may be formed in the reflection ring 68. The gas supply port 81 is communicatively connected to a gas supply pipe 83 via a buffer space 82 formed in an annular shape inside the side wall of the chamber 6. The gas supply pipe 83 is connected to a gas supply source 85. A valve 84 is interposed in the path of the gas supply pipe 83. When the valve 84 is opened, the nitrogen gas is supplied from the gas supply source 85 into the buffer space 82. The nitrogen gas flowing into the buffer space 82 spreads out in the buffer space 82, which has lower fluid resistance than that of the gas supply port 81, and is then supplied through the gas supply port 81 into the heat treatment space 65. Note that the treatment gas is not limited to nitrogen gas, and may be an inert gas such as argon (Ar) or helium (He) or a reactive gas such as oxygen ($O_2$), hydrogen ($H_2$), chlorine ($Cl_2$), hydrogen chloride (HCl), ozone ($O_3$), or ammonia ($NH_3$).

The chamber 6 also has, in its lower portion of the inner wall, a gas exhaust port 86 through which the gas in the heat treatment space 65 is exhausted. The gas exhaust port 86 is formed at a position below the recessed portion 62 and may be formed in the reflection ring 69. The gas exhaust port 86 is communicatively connected to a gas exhaust pipe 88 via a buffer space 87 formed in an annular shape inside the side wall of the chamber 6. The gas exhaust pipe 88 is connected to an exhaust part 190. A valve 89 is interposed in the path of the gas exhaust pipe 88. When the valve 89 is opened, the gas in the heat treatment space 65 is discharged from the gas exhaust port 86 through the buffer space 87 into the gas exhaust pipe 88. A configuration is also possible in which a plurality of gas supply ports 81 and a plurality of gas exhaust ports 86 are provided along the circumference of the chamber 6 or in which the gas supply port 81 and the gas exhaust port 86 have slit shapes. The gas supply source 85 and the exhaust part 190 may be mechanisms provided in the heat treatment apparatus 1, or they may be utilities in a factory where the heat treatment apparatus 1 is installed.

One end of the transport opening 66 is also connected to a gas exhaust pipe 191 through which the gas in the heat treatment space 65 is discharged. The gas exhaust pipe 191 is connected to the exhaust part 190 via a valve 192. When the valve 192 is opened, the gas in the chamber 6 is discharged through the transport opening 66.

Figure 2:
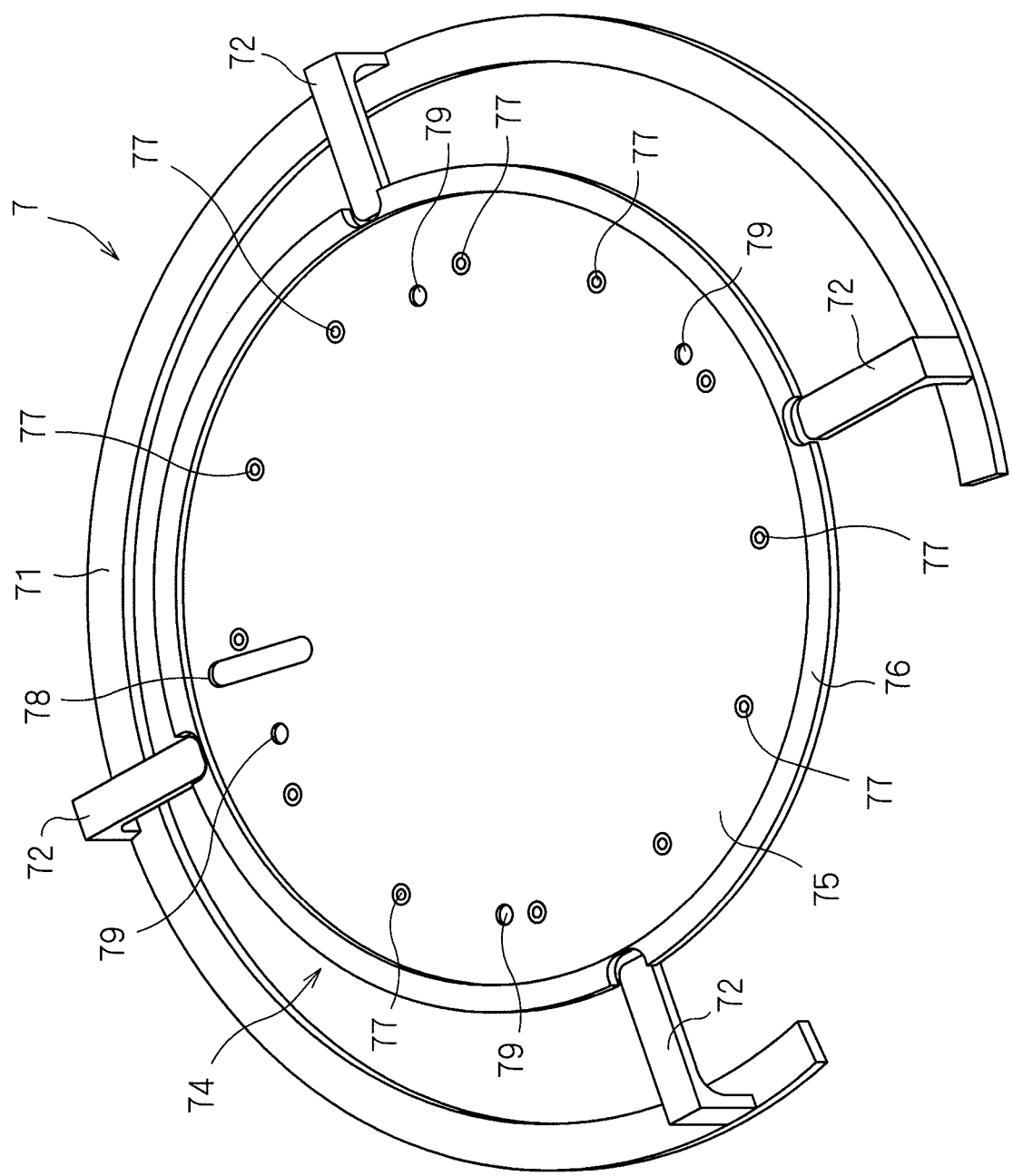
FIG. 2 is a perspective view showing an overall external view of a holder.

FIG. 2 is a perspective view showing an overall external view of the holder 7. The holder 7 includes a base ring 71, connecting parts 72, and a susceptor 74. The base ring 71, the connecting parts 72, and the susceptor 74 are all made of quartz. In other words, the entire holder 7 is made of quartz.

The base ring 71 is a quartz member having an arc shape that is an annular shape with a missing part. The missing part is formed to prevent interference between transfer arms 11 of the transfer mechanism 10, which will be described below, and the base ring 71. The base ring 71 is placed on the bottom surface of the recessed portion 62 and thus supported on the wall surface of the chamber 6 (see FIG. 1). On the upper surface of the base ring 71, a plurality of (in the present embodiment, four) connecting parts 72 are provided upright along the circumference of the base ring 71. The connecting parts 72 are also quartz members and are fixedly attached to the base ring 71 by welding.

Figure 3:
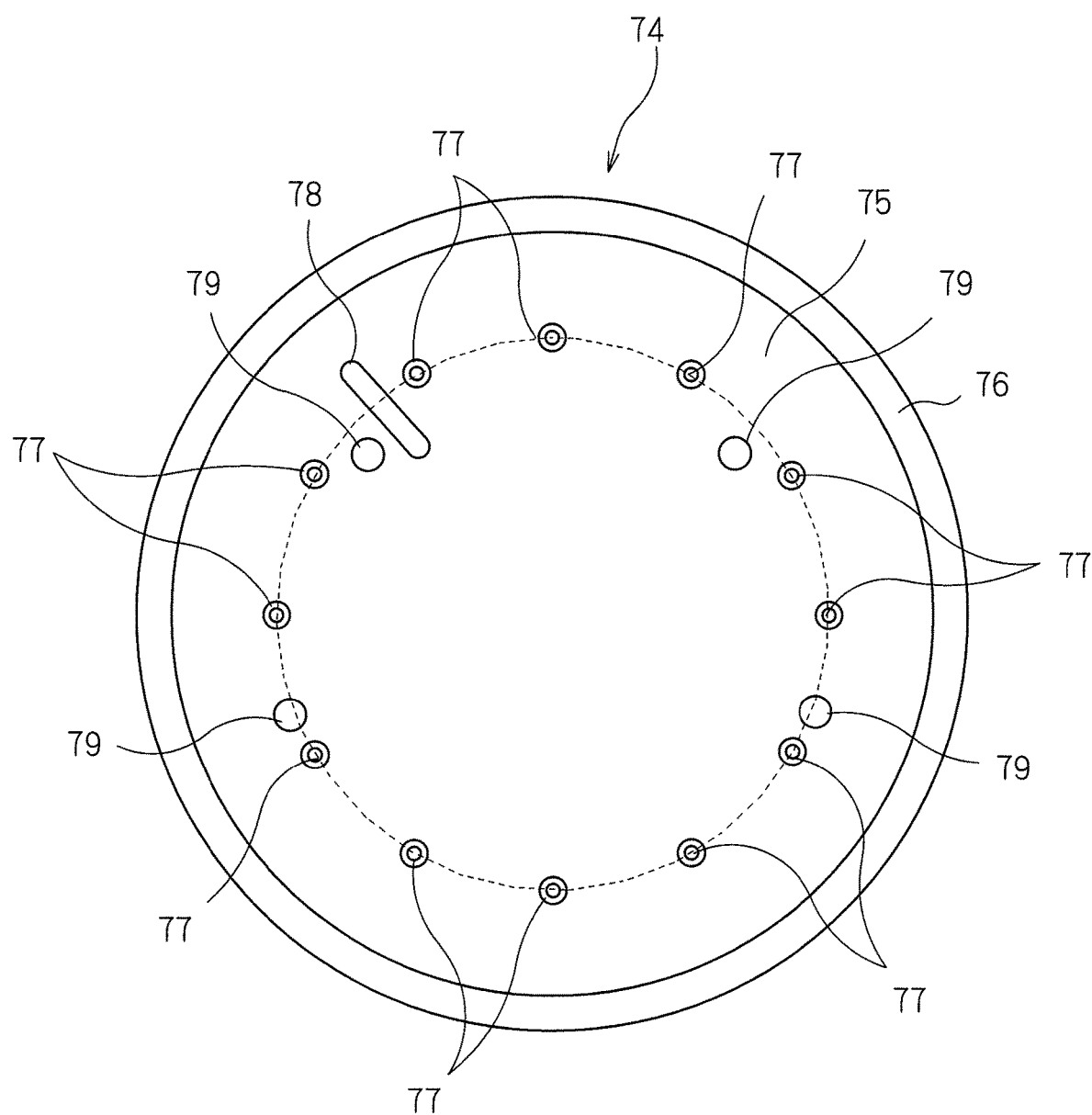
FIG. 3 is a plan view of a susceptor.

The susceptor 74 is supported by the four connecting parts 72 provided on the base ring 71. FIG. 3 is a plan view of the susceptor 74. FIG. 4 is a cross-sectional view of the susceptor 74. The susceptor 74 includes a holding plate 75, a guide ring 76, and a plurality of substrate support pins 77. The holding plate 75 is a substantially circular flat plate-like member made of quartz. The holding plate 75 has a diameter greater than that of the semiconductor wafer W. In other words, the holding plate 75 has a plane size greater than that of the semiconductor wafer W.

The guide ring 76 is installed on the peripheral portion of the upper surface of the holding plate 75. The guide ring 76 is an annular shaped member having an inside diameter greater than the diameter of the semiconductor wafer W. For example, when the semiconductor wafer W has a diameter of 300 mm, the guide ring 76 has an inside diameter of 320 mm. The inner circumference of the guide ring 76 is a tapered surface that tapers from above down to the holding plate 75. The guide ring 76 is made of the same quartz as that of the holding plate 75. The guide ring 76 may be welded to the upper surface of the holding plate 75, or may be fixed to the holding plate 75 with pins that are separately processed, for example. Alternatively, the holding plate 75 and the guide ring 76 may be processed as an integral member.

Of the upper surface of the holding plate 75, a region located closer to the inside than the guide ring 76 serves as a planar holding surface 75a on which the semiconductor wafer W is held. The plurality of substrate support pins 77 are provided upright on the holding surface 75a of the holding plate 75. In this preferred embodiment, a total of 12 substrate support pins 77 are provided upright every 30 degrees along the circumference of a circle concentric with the outer circumferential circle of the holding surface 75a (the inner circumferential circle of the guide ring 76). The diameter (the distance between opposed substrate support pins 77) of the circle along which the 12 substrate support pins 77 are disposed is smaller than the diameter of the semiconductor wafer W, and is 270 mm when the semiconductor wafer W has a diameter of 300 mm. All the substrate support pins 77 are made of quartz. The plurality of substrate support pins 77 may be provided upright by being welded to the upper surface of the holding plate 75, or may be processed together with the holding plate 75. The arrangement positions of the substrate support pins 77 will be further described below in detail.

Referring back to FIG. 2, the four connecting parts 72 provided upright on the base ring 71 and the peripheral portion of the holding plate 75 of the susceptor 74 are fixedly attached to each other by welding. In other words, the susceptor 74 and the base ring 71 are fixedly connected to each other by connecting parts 72. The base ring 71 of the holder 7 is supported on the wall surface of the chamber 6, and thus the holder 7 is attached to the chamber 6. With the holder 7 attached to the chamber 6, the holding plate 75 of the susceptor 74 is in a horizontal position (a position at which the normal coincides with the vertical direction). In other words, the holding surface 75a of the holding plate 75 is a horizontal surface.

The semiconductor wafer W transported into the chamber 6 is placed and held in the horizontal position on the susceptor 74 of the holder 7 attached to the chamber 6. At this time, the semiconductor wafer W is supported by the 12 substrate support pins 77 provided upright on the holding plate 75, and is held by the susceptor 74. More specifically, the semiconductor wafer W is supported by upper end portions of the 12 substrate support pins 77 in contact with the lower surface of the semiconductor wafer W. The 12 substrate support pins 77 have the uniform height (the distance from the upper end of the substrate support pins 77 to the holding surface 75a of the holding plate 75). Thus, the 12 substrate support pins 77 can support the semiconductor wafer W in the horizontal position.

The semiconductor wafer W is supported by the plurality of substrate support pins 77 with a predetermined gap from the holding surface 75a of the holding plate 75. The thickness of the guide ring 76 is greater than the height of the substrate support pins 77. Thus, the guide ring 76 prevents the position of the semiconductor wafer W supported by the plurality of substrate support pins 77 from being shifted in the horizontal direction.

As shown in FIGS. 2 and 3, the holding plate 75 of the susceptor 74 has a vertically penetrating opening 78. The opening 78 is formed to allow a radiation thermometer 120 (see FIG. 1) to receive radiation (infrared light) radiated from the back surface of the semiconductor wafer W held by the susceptor 74. More specifically, the radiation thermometer 120 receives, through the opening 78, the light radiated from the back surface of the semiconductor wafer W held by the susceptor 74, and the temperature of the semiconductor wafer W is measured by a separately placed detector. The holding plate 75 of the susceptor 74 further has four through holes 79 that lift pins 12 of the transfer mechanism 10, which will be described below, pass through to transfer the semiconductor wafer W.

Figure 5:
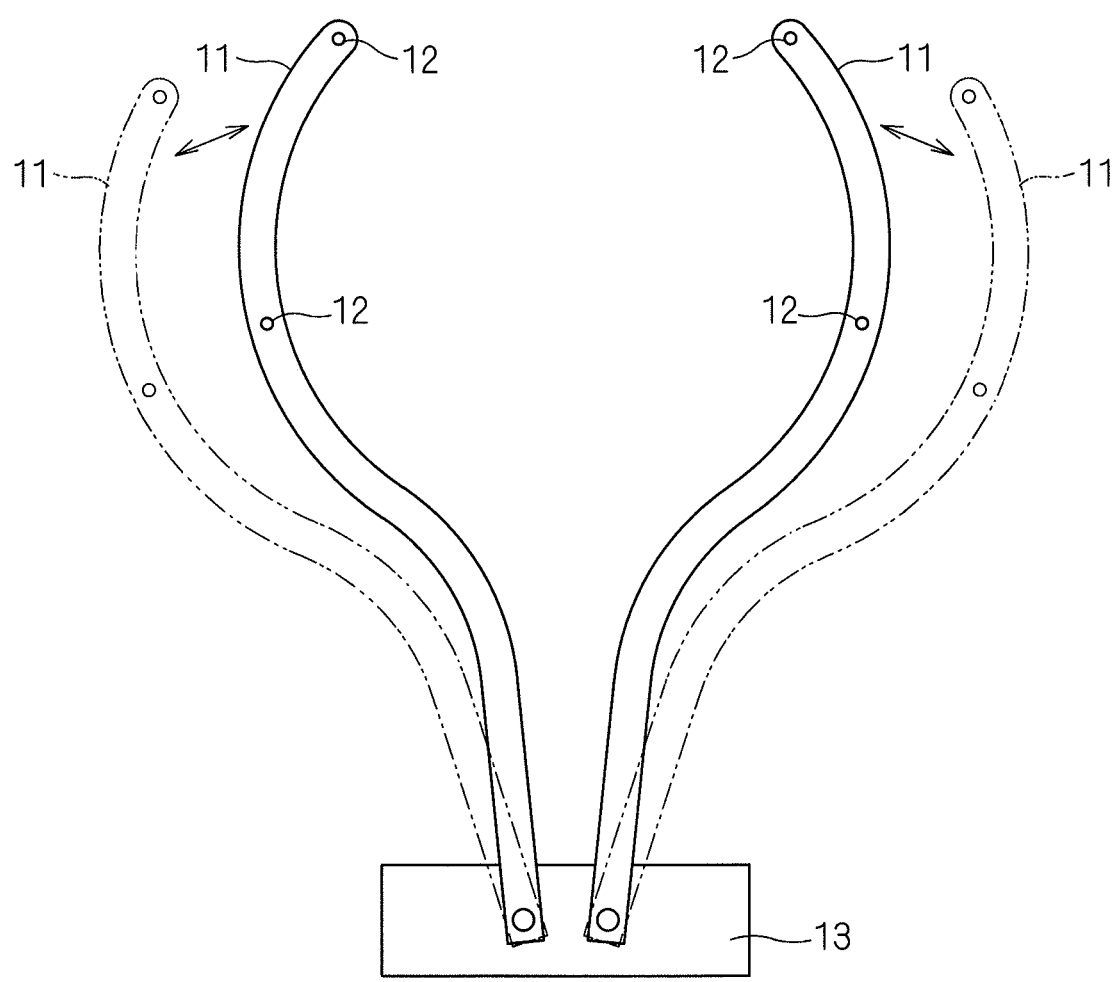
FIG. 5 is a plan view of a transfer mechanism.
Figure 6:
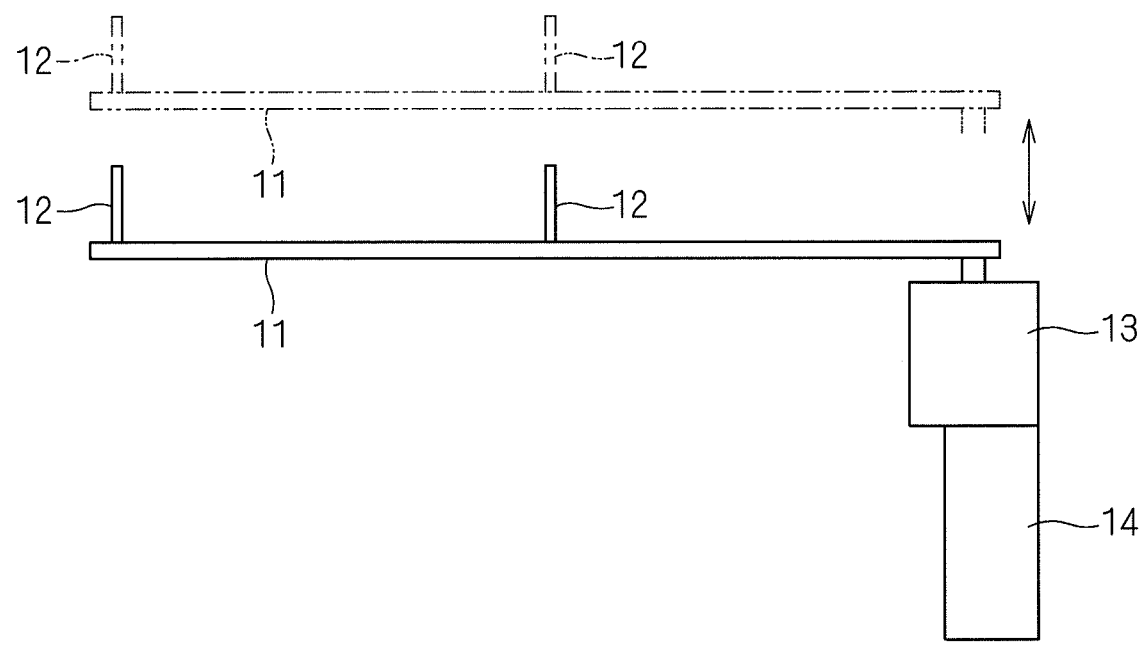
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape that extends substantially along the annular recessed portion 62. Each of the transfer arms 11 has two upright lift pins 12. Each of the transfer arms 11 is pivotable by a horizontal movement mechanism 13. The horizontal movement mechanism 13 horizontally moves the pair of transfer arms 11 between a transfer operation position (position indicated by the solid line in FIG. 5) at which the semiconductor wafer W is transferred to the holder 7 and a retracted position (position indicated by the dashed double-dotted line in FIG. 5) at which the transfer arms 11 do not overlap the semiconductor wafer W held by the holder 7 in a plan view. The horizontal movement mechanism 13 may be a mechanism for separately pivoting the transfer arms 11 by separate motors, or may be a mechanism for using a link mechanism to pivot the pair of transfer arms 11 in conjunction with each other by a single motor.

The pair of transfer arms 11 are also elevated and lowered together with the horizontal movement mechanism 13 by an elevating mechanism 14. When the elevating mechanism 14 elevates the pair of transfer arms 11 at the transfer operation position, a total of four lift pins 12 pass through the through holes 79 (see FIGS. 2 and 3) formed in the susceptor 74, and the upper ends of the lift pins 12 protrude from the upper surface of the susceptor 74. On the other hand, when the elevating mechanism 14 lowers the pair of transfer arms 11 at the transfer operation position to pull the lift pins 12 out of the through holes 79, and the horizontal movement mechanism 13 moves the pair of transfer arms 11 to open the transfer arms 11, each of the transfer arms 11 moves to its retracted position. The retracted position of the pair of transfer arms 11 is directly above the base ring 71 of the holder 7. Since the base ring 71 is placed on the bottom surface of the recessed portion 62, the retracted position of the transfer arms 11 is inside the recessed portion 62. Note that an exhaust mechanism (not shown) is also provided near the area where the driving parts (the horizontal movement mechanism 13 and the elevating mechanism 14) of the transfer mechanism 10 are provided so that the atmosphere around the driving parts of the transfer mechanism 10 is discharged to the outside of the chamber 6.

Referring back to FIG. 1, the flash heater 5 provided above the chamber 6 includes, inside a casing 51, a light source composed of a plurality of (in the present embodiment, 30) xenon flash lamps FL and a reflector 52 provided so as to cover the top of the light source. The casing 51 of the flash heater 5 has a lamp-light radiation window 53 attached to the bottom to the casing 51. The lamp-light radiation window 53, which forms the floor portion of the flash heater 5, is a plate-like quartz window made of quartz. Since the flash heater 5 is disposed above the chamber 6, the lamp-light radiation window 53 is opposed to the upper chamber window 63. The flash lamps FL apply flash light to the heat treatment space 65 from above the chamber 6 through the lamp-light radiation window 53 and the upper chamber window 63.

The plurality of flash lamps FL are each a rod-shaped lamp having an elongated cylindrical shape and are arranged in a planar array such that their longitudinal directions are parallel to one another along the main surface of the semiconductor wafer W held by the holder 7 (i.e., in the horizontal direction). Thus, the plane formed by the array of the flash lamps FL is also a horizontal plane.

The xenon flash lamps FL each include a rod-shape glass tube (discharge tube) and a trigger electrode provided on the outer circumferential surface of the glass tube, the glass tube containing xenon gas sealed therein and including an anode and a cathode that are disposed at opposite ends of the glass tube and connected to a capacitor. No electricity flows through the glass tube in a normal state even if electric charge is stored in the capacitor because xenon gas is an electrical insulating material. However, if an electrical breakdown is caused by application of a high voltage to the trigger electrode, the electricity stored in the capacitor instantaneously flows through the glass tube, and xenon atoms or molecules are excited at that time to cause light emission. The xenon flash lamps FL have the characteristics of being able to apply extremely intense light as compared with continuous lighting sources such as halogen lamps HL because the electrostatic energy previously stored in the capacitor is converted into an extremely short optical pulse of 0.1 to 100 milliseconds. In other words, the flash lamps FL are pulsed light-emitting lamps that instantaneously emit light in an extremely short time of less than a second. In addition, light emission time of the flash lamps FL can be adjusted by a coil constant of a lamp power supply that supplies power to the flash lamps FL.

The reflector 52 is provided above the plurality of flash lamps FL so as to cover all of the flash lamps FL. A basic function of the reflector 52 is to reflect the flash light emitted from the plurality of flash lamps FL toward the heat treatment space 65. The reflector 52 is formed of an aluminum alloy plate and has a surface (a surface opposed to the flash lamps FL) that is roughened by blasting.

The halogen heater 4 provided below the chamber 6 includes a plurality of (in the present embodiment, 40) halogen lamps HL inside a casing 41. The halogen heater 4 is a light emitting part that heats the semiconductor wafer W with the plurality of halogen lamps HL that emit light from below the chamber 6 through the lower chamber window 64 to the heat treatment space 65.

Figure 7:
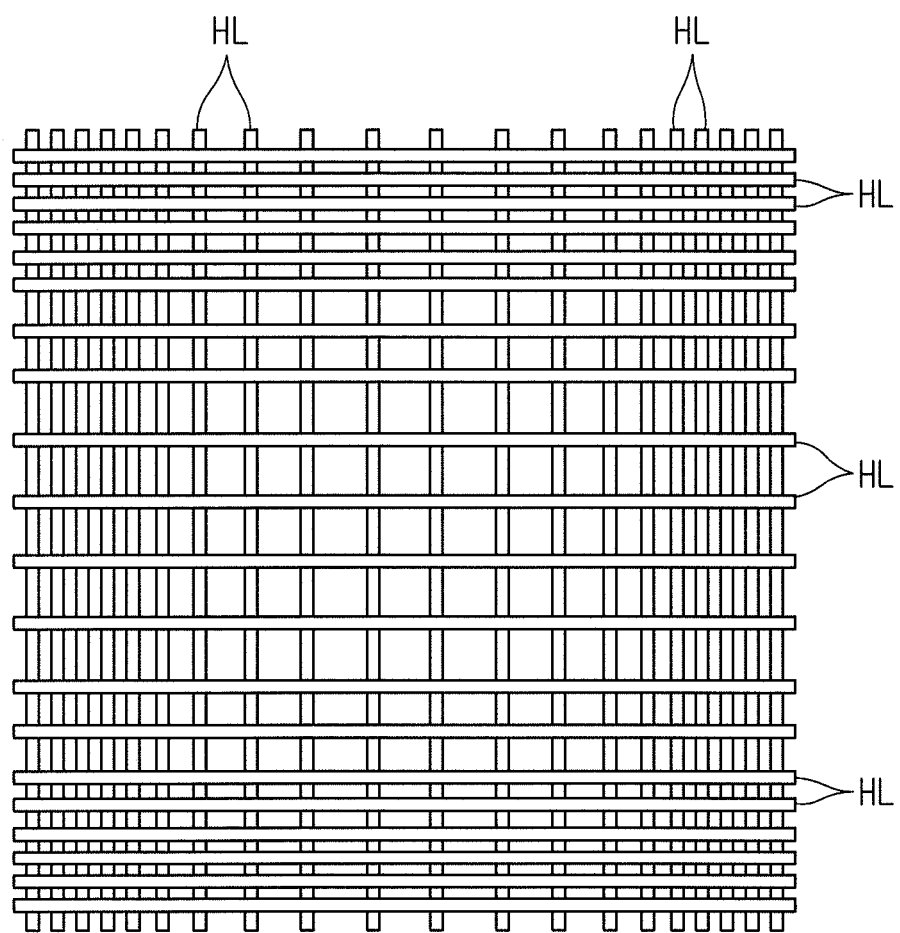
FIG. 7 is a plan view showing arrangement of a plurality of halogen lamps.

FIG. 7 is a plan view showing arrangement of the plurality of halogen lamps HL. 40 halogen lamps HL are divided into two rows so as to be disposed in an upper row and a lower row. 20 halogen lamps HL are disposed in the upper row close to the holder 7, and 20 halogen lamps HL are disposed in the lower row farther from the holder 7 than the upper row. Each of the halogen lamps HL is a rod-shaped lamp having an elongated cylindrical shape. The 20 halogen lamps HL in each of the upper row and the lower row are arranged such that their longitudinal directions are parallel to one another along the main surface of the semiconductor wafer W held by the holder 7 (i.e., in the horizontal direction). Thus, both of the planes formed by the arrays of the halogen lamps HL in the upper and lower rows are horizontal planes.

As shown in FIG. 7, in each of the upper and lower rows, the halogen lamps HL are disposed at a higher density in a region opposed to the peripheral portion of the semiconductor wafer W held by the holder 7 than in a region opposed to the central portion of the semiconductor wafer W. In other words, in both of the upper and lower rows, the pitch of arrangement of the halogen lamps HL in the peripheral portion of the array of the halogen lamps HL is shorter than that in the central portion of the array. This allows a larger amount of light to be applied to the peripheral portion of the semiconductor wafer W where the temperature tends to drop during heating by the application of light from the halogen heater 4.

A lamp group of the halogen lamps HL in the upper row and a lamp group of the halogen lamps HL in the lower row are arranged so as to intersect each other in the grid-like pattern. In other words, a total of 40 halogen lamps are disposed such that the longitudinal direction of the halogen lamps HL in the upper row and the longitudinal direction of the halogen lamps HL in the lower row are orthogonal to each other.

The halogen lamps HL are filament light sources in which a current is applied to a filament disposed in the glass tube to make the filament incandescent and emit light. The glass tube contains a gas sealed therein, the gas being prepared by introducing a trace amount of halogen elements (such as iodine and bromine) into inert gas such as nitrogen and argon. The introduction of the halogen elements allows the temperature of the filament to be set to a high temperature while suppressing breakage of the filament. Thus, the halogen lamps HL have the characteristics of lasting longer than typical incandescent lamps and being able to continuously apply intense light. In other words, the halogen lamps HL are continuous lighting lamps that continuously emit light for at least one or more seconds. The halogen lamps HL are the rod-shaped lamps, thereby lasting long. The halogen lamps HL disposed in the horizontal direction enhance the efficiency of radiation of the semiconductor wafer W located above the halogen lamps HL.

The halogen heater 4 also includes a reflector 43 provided below the halogen lamps HL in the two rows (FIG. 1) in the casing 41. The reflector 43 reflects the light emitted from the plurality of halogen lamps HL toward the heat treatment space 65.

The controller 3 controls the above-described various operating mechanisms provided in the heat treatment apparatus 1. The controller 3 has a similar hardware configuration to that of a commonly used computer. More specifically, the controller 3 includes a CPU that is a circuit for performing various types of computation processing, a ROM that is a read-only memory for storing basic programs, a RAM that is a readable and writable memory for storing various pieces of information, and a magnetic disk for storing control software and data. The processing in the heat treatment apparatus 1 proceeds by the CPU of the controller 3 executing a predetermined processing program.

The heat treatment apparatus 1 includes, in addition to the above-described components, various cooling structures in order to prevent an excessive temperature increase in the halogen heater 4, the flash heater 5, and the chamber 6 due to heat energy generating from the halogen lamps HL and the flash lamps FL during the heat treatment of the semiconductor wafer W. For example, the chamber 6 includes a water-cooled tube (not shown) in the wall. The halogen heater 4 and the flash heater 5 have an air cooling structure for forming a gas flow therein to exhaust heat. Air is also supplied to a gap between the upper chamber window 63 and the lamp-light radiation window 53 to cool the flash heater 5 and the upper chamber window 63.

Next, a procedure for the treatment of the semiconductor wafer W in the heat treatment apparatus 1 will be described. The semiconductor wafer W to be treated here is a semiconductor substrate implanted with impurities (ions) by ion implantation. The impurities are activated through heat treatment (annealing) involving the application of flash light by the heat treatment apparatus 1. The procedure for the treatment performed by the heat treatment apparatus 1 described below is implemented by the controller 3 controlling each operating mechanism of the heat treatment apparatus 1.

First, the valve 84 for supplying a gas and the valves 89, 192 for exhausting a gas are opened to start the supply and discharge of a gas into and from the chamber 6. When the valve 84 is opened, nitrogen gas is supplied from the gas supply port 81 into the heat treatment space 65. When the valve 89 is opened, the gas in the chamber 6 is discharged from the gas exhaust port 86. Accordingly, the nitrogen gas supplied from above the heat treatment space 65 within the chamber 6 flows downward and is discharged from below the heat treatment space 65.

The valve 192 is opened to discharge the gas in the chamber 6 also from the transport opening 66. The atmosphere around the driving parts of the transfer mechanism 10 is also discharged from an exhaust mechanism (not shown). During the heat treatment of the semiconductor wafer W in the heat treatment apparatus 1, the nitrogen gas is continuously supplied into the heat treatment space 65, and the amount of the nitrogen gas supplied is changed as appropriate in accordance with the processing step.

Subsequently, the gate valve 185 is opened to open the transport opening 66, and the ion-implanted semiconductor wafer W is transported into the heat treatment space 65 within the chamber 6 through the transport opening 66 by a transport robot located outside the apparatus. The semiconductor wafer W transported into the heat treatment space 65 by the transport robot is moved to a position directly above the holder 7 and stopped. Then, the pair of transfer arms 11 of the transfer mechanism 10 are horizontally moved from the retracted position to the transfer operation position and elevated, so that the lift pins 12 pass through the through holes 79 and protrude from the upper surface of the holding plate 75 of the susceptor 74 to receive the semiconductor wafer W. At this time, the lift pins 12 are elevated above the upper end of the substrate support pins 77.

After the semiconductor wafer W is placed on the lift pins 12, the transport robot retracts from the heat treatment space 65, and the transport opening 66 is closed with the gate valve 185. Then, the pair of transfer arms 11 are lowered so that the semiconductor wafer W is transferred from the transfer mechanism 10 to the susceptor 74 of the holder 7 and held in the horizontal position from below by the susceptor 74. The semiconductor wafer W is supported by the plurality of substrate support pins 77 provided upright on the holding plate 75 and is held on the susceptor 74. The semiconductor wafer W is held by the holder 7 with the front surface thereof, which has been patterned and implanted with impurities, facing upward. A predetermined gap is formed between the back surface (the main surface on the side opposite to the front surface) of the semiconductor wafer W supported by the plurality of substrate support pins 77 and the holding surface 75*a* of the holding plate 75. The pair of transfer arms 11 that have been lowered below the susceptor 74 are retracted to the retracted position, or in other words, to the inside of the recessed portion 62, by the horizontal movement mechanism 13.

After the semiconductor wafer W is held in the horizontal position from below by the susceptor 74 of the holder 7, all the 40 halogen lamps HL of the halogen heater 4 turn on at once to start preheating (assist-heating). The halogen light emitted from the halogen lamps HL passes through the lower chamber window 64 and the susceptor 74, which are made of quartz, and is applied to the back surface of the semiconductor wafer W. The semiconductor wafer W that has received the light emitted from the halogen lamps HL is preheated, and thus the temperature of the semiconductor wafer W increases. Here, the transfer arms 11 of the transfer mechanism 10 will not impede the heating with the halogen lamps HL because they have already been retracted into the recessed portion 62.

For preheating with the halogen lamps HL, the temperature of the semiconductor wafer W is measured by the radiation thermometer 120. More specifically, the radiation thermometer 120 receives infrared light radiated through the opening 78 from the back surface of the semiconductor wafer W held by the susceptor 74, and measures the increasing wafer temperature. The measured temperature of the semiconductor wafer W is transmitted to the controller 3. The controller 3 controls the output of the halogen lamps HL while monitoring whether the temperature of the semiconductor wafer W raised by the application of light from the halogen lamps HL has reached a predetermined preheating temperature T1. More specifically, the controller 3 performs feedback control of output from the halogen lamps HL on the basis of measurements by the radiation thermometer 120 so that the temperature of the semiconductor wafer W reaches the preheating temperature T1. The preheating temperature T1 is set to about 200° C. to 800° C. at which the impurities implanted in the semiconductor wafer W are not caused to be diffused by heat, and preferably, may be set to about 350° C. to 600° C. (in the present embodiment, 600° C.).

After the temperature of the semiconductor wafer W reaches the preheating temperature T1, the controller 3 temporarily maintains the semiconductor wafer W at the preheating temperature T1. Specifically, at the point in time when the temperature of the semiconductor wafer W measured by the radiation thermometer 120 reaches the preheating temperature T1, the controller 3 controls the output of the halogen lamps HL to maintain the temperature of the semiconductor wafer W approximately at the preheating temperature T1.

This preheating with the halogen lamps HL allows the temperature of the entire semiconductor wafer W to uniformly increase to the preheating temperature T1. In the preheating stage with the halogen lamps HL, the temperature of the peripheral portion of the semiconductor wafer W, where heat more easily dissipates, tends to drop lower than the temperature of the central portion. On the other hand, the halogen lamps HL in the halogen heater 4 are arranged with higher density in the region opposed to the peripheral portion of the semiconductor wafer W than in the region opposed to the central portion of the semiconductor wafer W. Accordingly, a larger amount of light is applied to the peripheral portion of the semiconductor wafer W where heat easily dissipates. In this condition, the in-plane temperature distribution of the semiconductor wafer W becomes uniform in the preheating stage. Moreover, the mirror-finished inner circumferential surface of the reflection ring 69 attached to the chamber side portion 61 increases the amount of light reflected by the inner circumferential surface of the reflection ring 69 toward the peripheral portion of the semiconductor wafer W. Accordingly, the in-plane temperature distribution of the semiconductor wafer W becomes more uniform in the preheating stage.

After a lapse of a predetermined period from the time when the temperature of the semiconductor wafer W has reached the preheating temperature T1 by the application of light emitted from the halogen lamps HL, flash light is applied from the flash lamps FL of the flash heater 5 to the front surface of the semiconductor wafer W. At this time, part of the flash light radiated from the flash lamps FL travels directly into the chamber 6, whereas another part of the flash light is reflected by the reflector 52 and then travels into the chamber 6. The flash light is applied to the semiconductor wafer W for flash heating.

Flash heating is performed with the flash lamps FL emitting the flash light, allowing for an increase in temperature of the front surface of the semiconductor wafer W in a short time. More specifically, the flash light emitted from the flash lamps FL is extremely short intense flash light that results from the conversion of the electrostatic energy previously stored in the capacitor into an extremely short optical pulse and whose irradiation time is approximately longer than or equal to 0.1 millisecond and shorter than or equal to 100 milliseconds. The temperature of the front surface of the semiconductor wafer W subjected to flash heating with the flash lamps FL emitting the flash light instantaneously rises to a treatment temperature T2 of greater than or equal to 1000° C., and then rapidly drops after the activation of the impurities implanted in the semiconductor wafer W. Since the temperature of the front surface of the semiconductor wafer W can increase and decrease in an extremely short time in the manner above, the heat treatment apparatus 1 can activate the impurities while suppressing thermal diffusion of the impurities implanted in the semiconductor wafer W. Note that the time required for the activation of the impurities is extremely short as compared with the time required for the thermal diffusion of the impurities, and thus the activation will be completed even in such a short time of approximately 0.1 to 100 milliseconds that causes no diffusion.

After completion of the flash heat treatment and a lapse of a predetermined period of time, the halogen lamps HL turn off. The temperature of the semiconductor wafer W thus rapidly drops from the preheating temperature T1. The decreasing temperature of the semiconductor wafer W is measured by the radiation thermometer 120, and the measurement result is transmitted to the controller 3. The controller 3 monitors whether the temperature of the semiconductor wafer W has dropped to a predetermined temperature on the basis of the measurement result. After the temperature of the semiconductor wafer W has dropped to the predetermined temperature or lower, the pair of the transfer arms 11 of the transfer mechanism 10 are moved horizontally again from the retracted position to the transfer operation position and moved upward, so that the lift pins 12 protrude from the upper surface of the susceptor 74 and receive the heat-treated semiconductor wafer W from the susceptor 74. Then, the transport opening 66 closed by the gate valve 185 is opened and the semiconductor wafer W placed on the lift pins 12 is transported by the transport robot located outside the apparatus. This completes the heat treatment of the semiconductor wafer W in the heat treatment apparatus 1.

During the application of the flash light emitted from the flash lamps FL, the temperature of the front surface of the semiconductor wafer W instantaneously increases to the treatment temperature T2 of greater than or equal to 1000° C., whereas the temperature of the back surface of the semiconductor wafer W at that time does not increase so much from the preheating temperature T1. In other words, a difference in temperature instantaneously occurs between the front and back surfaces of the semiconductor wafer W. As a result, abrupt thermal expansion occurs only in the front surface of the semiconductor wafer W, whereas the back surface hardly undergoes thermal expansion. Thus, the semiconductor wafer W instantaneously warps such that the front surface thereof becomes raised.

FIG. 8 is a schematic view showing how the semiconductor wafer W warps during the application of the flash light. The application of the flash light abruptly increases the temperature of only the front surface of the semiconductor wafer W in which thermal expansion occurs. Thus, the semiconductor wafer W warps such that the front surface thereof becomes raised. As a result, the lower surface of the semiconductor wafer W is inevitably bent inward. At this time, compressive stress is exerted on the vicinity of the central portion of the lower surface of the semiconductor wafer W as indicated with arrows AR 81 while tensile stress is exerted on the peripheral portion of the lower surface as indicated with arrows AR 82. In other words, stress is exerted on the vicinity of the central portion and the peripheral portion of the lower surface of the semiconductor wafer W in opposite directions (tensile direction and compressive direction) during the application of the flash light. This indicates the presence of a portion on which no stress is exerted in the lower surface of the semiconductor wafer W during the application of the flash light. The portion serves as a boundary between the region on which compressive stress is exerted and the region on which tensile stress is exerted in the lower surface of the semiconductor wafer W.

Figure 9:
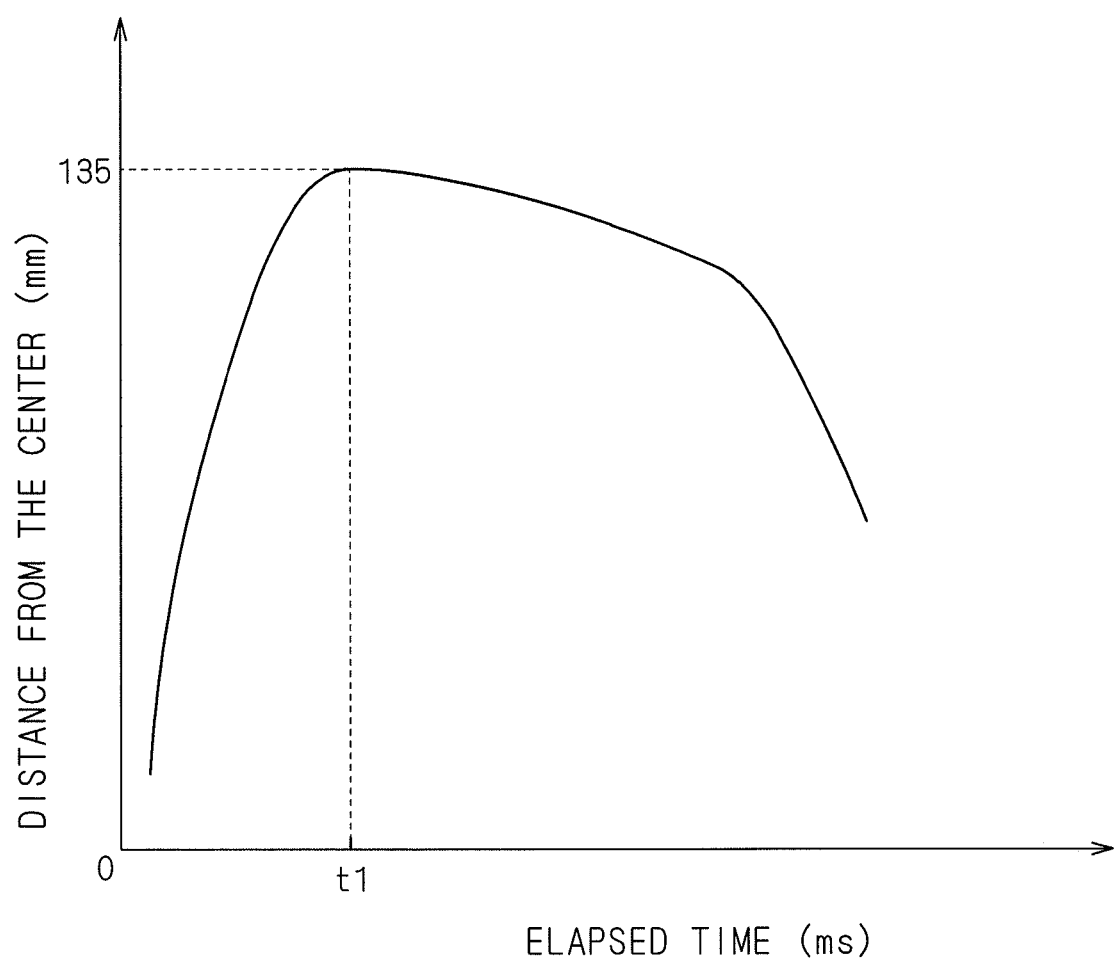
FIG. 9 shows a transition of a position on which no stress is exerted in a lower surface of the semiconductor wafer during the application of the flash light.

FIG. 9 shows a transition of a position on which no stress is exerted in the lower surface of the semiconductor wafer W during the application of the flash light. FIG. 9 shows the transition of the position on which no stress is exerted in the lower surface of the semiconductor wafer W having a diameter of 300 mm when the flash light is applied to the upper surface thereof. In FIG. 9, the horizontal axis indicates elapsed time since the start of the application of the flash light emitted from the flash lamps FL, and the vertical axis indicates a distance (diameter) from the center of the lower surface of the semiconductor wafer W.

As shown in FIG. 9, the position on which no stress is exerted varies with the elapsed time since the start of the application of the flash light, the position serving as the boundary between the region on which compressive stress is exerted and the region on which tensile stress is exerted in the lower surface of the semiconductor wafer W. When the elapsed time since the start of the application of the flash light is t1, the upper surface of the semiconductor wafer W reaches the maximum temperature (above-mentioned treatment temperature T2), and the greatest bending stress is exerted on the semiconductor wafer W. When the elapsed time since the start of the application of the flash light is t1 (that is to say, when the upper surface of the semiconductor wafer W reaches the maximum temperature), the position on which no stress is exerted in the lower surface of the semiconductor wafer W is located farthest from the center, and a distance at that time from the center to the position on which no stress is exerted is 135 mm.

Figure 10:
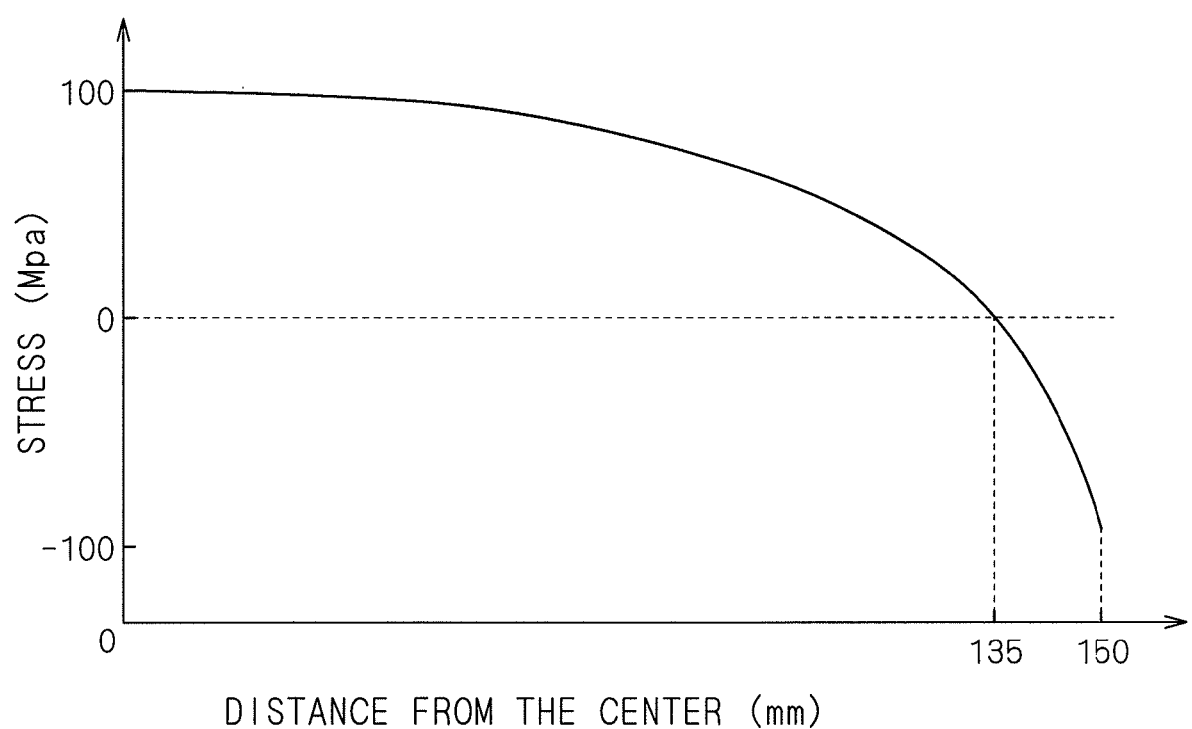
FIG. 10 shows a stress distribution of the lower surface of the semiconductor wafer during the application of the flash light.

FIG. 10 shows a stress distribution of the lower surface of the semiconductor wafer W during the application of the flash light. FIG. 10 shows the stress distribution of the lower surface of the semiconductor wafer W at the moment when the upper surface of the semiconductor wafer W having the diameter of 300 mm reaches the maximum temperature by being irradiated with the flash light (that is to say, at the moment when the elapsed time since the start of the application of the flash light is t1). In FIG. 10, the horizontal axis indicates a distance from the center of the lower surface of the semiconductor wafer W, and the vertical axis indicates stress.

When the upper surface of the semiconductor wafer W reaches the maximum temperature after time t1 has elapsed since the start of the application of the flash light emitted from the flash lamps FL to the upper surface, compressive stress is exerted on the central region at a distance of less than 135 mm from the center of the lower surface of the semiconductor wafer W, and tensile stress is exerted on the peripheral region at a distance of greater than 135 mm from the center thereof. No stress is exerted in the position at a distance of 135 mm from the center of the lower surface of the semiconductor wafer W, the position serving as the boundary between the central region on which compressive stress is exerted and the peripheral region on which tensile stress is exerted.

In the present embodiment, the 12 substrate support pins 77 are provided on the susceptor 74 so as to contact the position in the lower surface at the distance of 135 mm from the center of the semiconductor wafer W and on which no stress is exerted at the moment when the upper surface of the semiconductor wafer W reaches the maximum temperature during the application of the flash light. Specifically, the 12 substrate support pins 77 are provided upright every 30 degrees on the holding surface 75a of the holding plate 75 along the circumference of the circle that is concentric with the outer circumferential circle of the semiconductor wafer W and that has the diameter of 270 mm (the circle indicated by the broken line in FIG. 3). The 12 substrate support pins 77 contact the circle that is concentric with the outer circumferential circle of the semiconductor wafer W and that has the diameter of 270 mm on the lower surface of the semiconductor wafer W.

During the application of the flash light, when the substrate support pins 77 contact a position on which stress is exerted in the lower surface of the semiconductor wafer W, that is to say, when the substrate support pins 77 contact the central region on which compressive stress is exerted and at the distance of less than 135 mm from the center or the peripheral region on which tensile stress is exerted and at the distance of greater than 135 mm from the center, stress concentration occurs in the contact position of the semiconductor wafer W that contacts the substrate support pins 77, causing the semiconductor wafer W to break.

In the present embodiment, when the upper surface of the semiconductor wafer W is irradiated with the flash light emitted from the flash lamps FL and thus reaches the maximum temperature, the plurality of substrate support pins 77 contact the position on which no stress is exerted in the lower surface of the semiconductor wafer W. Thus, stress concentration does not occur in the contact position of the lower surface of the semiconductor wafer W that contacts the plurality of substrate support pins 77. This can prevent the semiconductor wafer W from breaking during the application of the flash light emitted from the flash lamps FL.

While the preferred embodiment of the present invention has been described above, various modifications in addition to those described above may be made to the invention without departing from the purpose of the invention. For example, the semiconductor wafer W having the diameter of 300 mm has been described in the preferred embodiment above, but the present invention is not limited thereto. The semiconductor wafer W may have a diameter of 450 mm, for example. For the semiconductor wafer W having the diameter of 450 mm, the position on which no stress is exerted in the lower surface at the moment when the upper surface of the semiconductor wafer W reaches the maximum temperature during the application of the flash light is located at a distance of 405 mm from the center of the lower surface of the semiconductor wafer W. Thus, the plurality of substrate support pins 77 are provided so as to contact the circle that is concentric with the outer circumferential circle of the semiconductor wafer W having the diameter of 450 mm and that has the diameter of 405 mm on the lower surface of the semiconductor wafer W. In this manner, similarly to the preferred embodiment above, when the upper surface of the semiconductor wafer W reaches the maximum temperature during the application of the flash light, the plurality of substrate support pins 77 contact the position on which no stress is exerted in the lower surface of the semiconductor wafer W, and thus stress concentration does not occur in the contact position of the semiconductor wafer W that contacts the substrate support pins 77. This can prevent the semiconductor wafer W from breaking during the application of the flash light.

The semiconductor wafer W may have a diameter other than 300 mm and 450 mm. To summarize, it is sufficient as long as the plurality of substrate support pins 77 are provided so as to contact the position on which no stress is exerted in the lower surface of the semiconductor wafer W when the upper surface of the semiconductor wafer W is irradiated with the flash light emitted from the flash lamps FL and thus reaches the maximum temperature. The position on which no stress is exerted in the lower surface at the moment when the upper surface of the semiconductor wafer W reaches the maximum temperature during the application of the flash light is located on a circle that is concentric with the outer circumferential circle of the semiconductor wafer W and that has a diameter of 90% of the diameter of the semiconductor wafer W. In other words, it is sufficient as long as the plurality of substrate support pins 77 are provided so as to contact the circle that is concentric with the outer circumference circle of the semiconductor wafer W and that has the diameter of 90% of the diameter of the semiconductor wafer W. In this manner, stress concentration does not occur in the contact position of the semiconductor wafer W that contacts the substrate support pins 77, which can prevent the semiconductor wafer W from breaking during the application of the flash light.

Although the flash heater 5 includes the 30 flash lamps FL in the preferred embodiment above, the present invention is not limited thereto. The flash heater 5 may include a freely-selected number of flash lamps FL. The flash lamps FL are not limited to xenon flash lamps, and may be krypton flash lamps. The number of halogen lamps HL included in the halogen heater 4 is not limited to 40 and may be freely selected.

Although the semiconductor wafer W is preheated by the application of the halogen light from the halogen lamps HL in the preferred embodiment above, a preheating technique is not limited to this technique. The semiconductor wafer W may be placed on a hot plate and be preheated instead. Even in this case, the same arrangement of the plurality of substrate support pins 77 on the susceptor located on the hot plate as the arrangement in the preferred embodiment above can prevent the semiconductor wafer W from breaking during the application of the flash light.

A substrate to be treated by the heat treatment apparatus of the present invention is not limited to a semiconductor wafer, and may be a glass substrate used in a flat-panel display such as a liquid crystal display, or a substrate for use in solar cell. The technology of the present invention is also applicable to heat treatment of a high dielectric gate insulating film (high-k film), bonding between metal and silicon, crystallization of polysilicon, or the like.

While the invention has been described in detail, the foregoing description is in all aspects illustrative and not restrictive. It is therefore understood that numerous other modifications and variations can be devised without departing from the scope of the invention.

What is claimed is:

1. A heat treatment method for irradiating a substrate having a center with flash light emitted from a flash lamp to heat the substrate, comprising the steps of:
   (a) placing a substrate at upper ends of a plurality of support pins that are provided upright on a holding plate having a planar holding surface to hold the substrate; and
   (b) irradiating an upper surface of the substrate with flash light, whose irradiation time is longer than or equal to 0.1 millisecond and shorter than or equal to 100 milliseconds, emitted from the flash lamp, in a manner so that a lower surface of the substrate becomes subjected to a compressive stress at a central region thereof and to a tensile stress outside the central region when the upper surface of the substrate reaches a maximum temperature, with a boundary therebetween at which no stress is exerted on the lower surface, wherein
   in the step (a), the substrate is placed on the plurality of support pins so that the plurality of support pins contact the lower surface of the substrate only at the boundary at which no stress is exerted on the lower surface of the substrate when the upper surface of the substrate reaches the maximum temperature in the step (b), said boundary where no stress is exerted on the lower surface of said substrate being located at a given distance from said center of said substrate.

2. The heat treatment method according to claim 1, wherein
   the substrate has a circular plate shape, and
   in the step (a), the plurality of support pins contacts a circle that is concentric with an outer circumferential circle of the substrate and has a diameter of 90% of the diameter of the substrate.

3. The heat treatment method according to claim 2, wherein
   the plurality of support pins comprise 12 support pins located every 30 degrees along the circumference of the concentric circle.

* * * * *